United States Patent [19]
Winters

[11] 4,190,488
[45] Feb. 26, 1980

[54] ETCHING METHOD USING NOBLE GAS HALIDES

[75] Inventor: Harold F. Winters, San Jose, Calif.

[73] Assignee: International Business Machines Corporation, Armonk, N.Y.

[21] Appl. No.: 934,731

[22] Filed: Aug. 21, 1978

[51] Int. Cl.² .................. C23F 1/00; H01L 21/306
[52] U.S. Cl. ............................... 156/643; 156/646; 204/192 E; 252/79.1
[58] Field of Search .............. 204/164, 169, 192 CE, 204/192 E, 298; 423/262; 252/79.1, 79.3; 156/643, 646, 656, 657, 664, 662, 345; 250/531

[56] References Cited

U.S. PATENT DOCUMENTS

| | | | |
|---|---|---|---|
| 3,192,016 | 6/1965 | Malm et al. | 23/262 |
| 3,377,136 | 4/1968 | Morrow | 23/262 |
| 3,615,956 | 10/1971 | Irving et al. | 156/645 |
| 3,975,252 | 8/1976 | Fraser et al. | 204/192 E |
| 4,028,155 | 6/1977 | Jacob | 156/643 |

Primary Examiner—William A. Powell
Attorney, Agent, or Firm—Pollock, Vande Sande and Priddy

[57] ABSTRACT

A method for etching using a noble gas halide.

16 Claims, 2 Drawing Figures

T ~ 300 K
TOTAL PRESSURE ~ 1.3 x $10^{-2}$ Torr

ETCHING METHOD USING NOBLE GAS HALIDES

DESCRIPTION

Technical Field

The present invention is concerned with the etching of a surface and preferably those surfaces, all of the components of which are capable of forming volatile substances under the etching conditions. The present invention is particularly concerned with the use of certain halides as the etchants.

It has been found, according to the present invention, that the apparatus required for the etching is quite simple as compared to that required by sputter and plasma etching techniques. It should be recognized that the techniques of the present invention can be employed in sputter etching and plasma etching, if desired.

An advantage of the present invention is that the etching can occur at room temperature or below. In addition, according to preferred aspects of the present invention, the ambient atmosphere around the surface being etched is primarily concerned with only one active component which is in direct contrast to most other etching processes. According to the present invention, the gases released other than the halogen do not react with the surrounding surfaces and therefore do not inhibit the etching process. In addition, because of the relative simplicity of the apparatus employed, the parameters of the process can be easily controlled even on a commercial scale.

The present invention is particularly suitable for etching silicon, polycrystalline silicon, and metals. Oxides of silicon are substantially not etchable with the noble gas halides under the conditions of temperature and pressure tested. Therefore, silicon oxides can readily be used as masking material to protect those portions of the surface not to be etched.

DESCRIPTION OF PRIOR ART

In the manufacture of various items such as semiconductor chips or devices, a number of etching steps are required. In fact, in the manufacture of semiconductor chips, the steps of etching different layers which constitute the finished chip are among the most critical and crucial steps. One method widely employed for etching is to overlay the surface to be etched with a suitable mask and then immerse the surface and mask in a chemical solution which attacks the surface to be etched while leaving the mask intact. These wet chemical etching processes suffer from the difficulty of achieving well-defined edges on the etched surfaces. This is due to the chemicals undercutting the mask such as by seeping under the mask and thereby continuing to attack the surface to be etched even under portions of the masked area.

A technique termed "plasma etching" has been suggested for the manufacture of semiconductor chips. This procedure generally involves filling a container such as a bell-jar with a gas such as $CF_4$ which dissociates to produce radicals which are chemically reactive. The surface which is to be etched is covered by a mask and introduced into the container along with the reactive gas. The parent gas is usually dissociated forming positive and negative ions and radicals by coupling radio frequency power to the plasma by a capacitive or inductive coupling. It is believed that the dissociated atoms or radicals chemically interact with the surface to be etched. In such a process, the substrate is positioned at various locations which are exposed to the plasma gases. Plasma etching like chemical etching processes suffers from the tendency to undercut the masked areas.

Another process for etching semiconductor chips or thin film circuits is known as "sputter etching". Generally in sputter etching, a container such as bell-jar is filled with an inert gas such as argon. In the container are positioned an anode and cathode. The cathode is negatively biased relative to the anode, for instance, by means of an applied radio-frequency signal. The surface to be etched is covered by the suitable mask and is then placed on the cathode. When a radio frequency potential is applied to the cathode, the inert gas in the region between the cathode and the anode is ionized hence the positive ions are attracted toward the cathode. The ions which strike the surface to be etched serve to knock atoms off the surface thereby gradually etching through the material. Sputter etching produces better defined edges as compared to the wet chemical etching processes but is relatively slow and very time consuming.

To overcome the slowness of such a sputter etching process, it has been suggested to employ as the etching gas in a sputter etching process, a chemically reactive gas such as $CF_4$. By applying an electrical field, the reactive gas dissociates and the chemically-reactive ions are attracted to the cathode. It is believed that the surface is etched both by chemical interaction with the active radicals and by the momentum transfer of the ions impinging on the surface. This is distinguished from plasma etching wherein only the chemical interaction occurs during the etching process. Moreover, in view of the electric field attracting the ions to the cathode, the ions impinge on the surface to be etched predominantly in a direction perpendicular to that surface. Accordingly, the process has been referred to as reactive ion etching and provides well-defined vertically etched sidewalls.

The sputter etching techniques described above as well as plasma etching techniques suffer from the disadvantage that such require a somewhat complex apparatus involved in applying the necessary electrical energy to the system such as radio frequency power.

DISCLOSURE OF THE INVENTION

For a further understanding of the invention, and the objects and advantages thereof, reference will be had to the following description and the accompanying drawings, and to the appended claims in which the various novel features of the invention are more particularly set forth.

The present invention is directed to a method for etching a surface. The process includes exposing the surface to be etched to the vapor of at least one noble gas halide for a time sufficient to etch the surface to the desired extent.

BEST MODE FOR CARRYING OUT THE INVENTION

Figure 1:
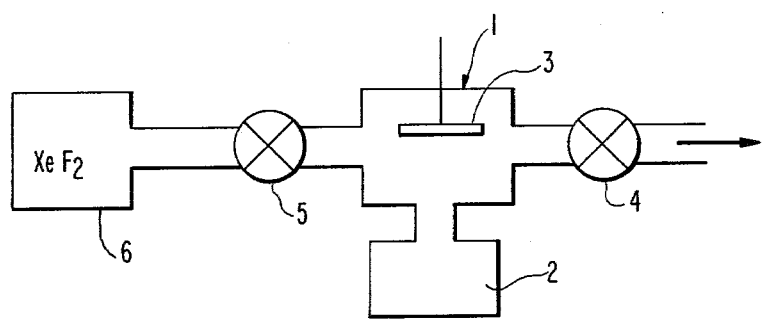
FIG. 1 is a schematic sectional view of apparatus which can be used to carry out the process of the present invention.

FIG. 1 depicts diagrammatically an apparatus suitable for carrying out the process of the present invention. In FIG. 1, there is illustrated a vacuum chamber 1 which contains a pressure gauge 2 and means for supporting the desired substrate 3. Also included is a valve 4 connected to a vacuum pump (not shown) and valve 5 connected to the source 6 of the noble gas halide. The container 6 for the halide should be substantially free from impurity gases such as air or oxygen. Upon operation, the substrate to be etched is placed in the vacuum chamber 1 being supported by support 3 and the vacuum chamber 1 is then evacuated to the desired pressure via a vacuum pump (not shown) by opening valve 4. Valve 5 is opened slightly to emit the desired amount of noble gas halide for the etching process. The above apparatus can be constructed of any material which is not attacked by the etchant such as stainless steel, monel, and glass.

The surfaces which are etched according to the present invention are preferably those materials, all of the components of which are capable of forming volatile substances under the condition of the etching process. The surface can be a single material or compound or mixtures or alloys. Examples of some suitable materials include silicon, polycrystalline silicon, and metals such as titanium, tantalum, tungsten, and molybdenum. The present invention is particularly beneficial in those processes wherein a resist is present. When the process is used in the preparation of patterned articles, a mask of, for instance, a photoresist or electron beam resist material is applied on top of the surface in order that only selected portions of the surface will be exposed to the halide and be etched. Suitable resist materials include oxides and nitrides such as silicon dioxide and silicon nitride which will not etch to any noticeable degree under conditions specifically employed herein.

The etchant employed according to the present invention is a halide and preferably a fluoride or chloride of a noble gas. The noble gas is preferably krypton, xenon, or radon and is most preferably xenon. The etchants are selected such that they are not reactive with the walls of the reactor but are reactive upon the surface to be etched under the conditions of the process forming gaseous products. In addition, the surface to be etched is one wherein components thereof form volatile fluorides which are inherently desorbed from the surface of the substrate. The etchant employed can contain other constituents either in admixture or in chemical combination thereof so long as such do not adversely affect the function of the reactive noble gas halides to an unacceptable or undesired extent. It is noted that the noble gas halides will inherently contain some quantities of free noble gas. Various noble gas halides suitable for the present invention are well known as exemplified by U.S. Pat. Nos. 3,192,016 to Malm et al, 3,326,638 to Cleaver, and 3,377,136 to Morrow.

That the noble gas halides employed according to the present invention provide the type of etching achieved herein is quite surprising since other halogen gases such as $CF_4$, $C_2F_6$, $C_3F_8$, $C_2F_4$, $COF_2$, $CF_3H$, $CCl_4$, $CF_3O_2CF_3$, and the like do not cause etching by mere exposure to the surface as achieved by the present invention. In addition, the exposure of surfaces such as silicon to high pressures of $F_2$ produces only very slow etching.

The preferred etchants employed according to the present invention include $XeF_2$, $XeF_4$, $XeF_6$, $KrF_2$, $KrF_4$, and $KrF_6$. The most preferred etchant employed according to the present invention is $XeF_2$. Mixtures of noble gas halides can be used if desired. The etchants employed according to the present invention during the process provide reactive halogen species and inert noble gas species such as Xe in the gas phase. A typical sequence using $XeF_2$ to etch Si is believed to be as follows:

$$2 \text{ XeF}_2 \text{ (gas)} \rightarrow 2 \text{ Xe (gas)} + 4 \text{ F}$$

(adsorbed on Si surface)→

$$2 \text{ Xe (gas)} + \text{SiF}_4 \text{ (gas)}.$$

The process of the present invention is generally carried out under vacuum and more usually at pressures of about $10^{-4}$ torr to about 1 torr and preferably at least $10^{-3}$ torr to about $10^{-2}$ torr.

The minimum flow rate of the noble gas halide is generally determined by the desired etch rate. The maximum flow rate is primarily determined by the capacity of the pumping system.

Figure 2:
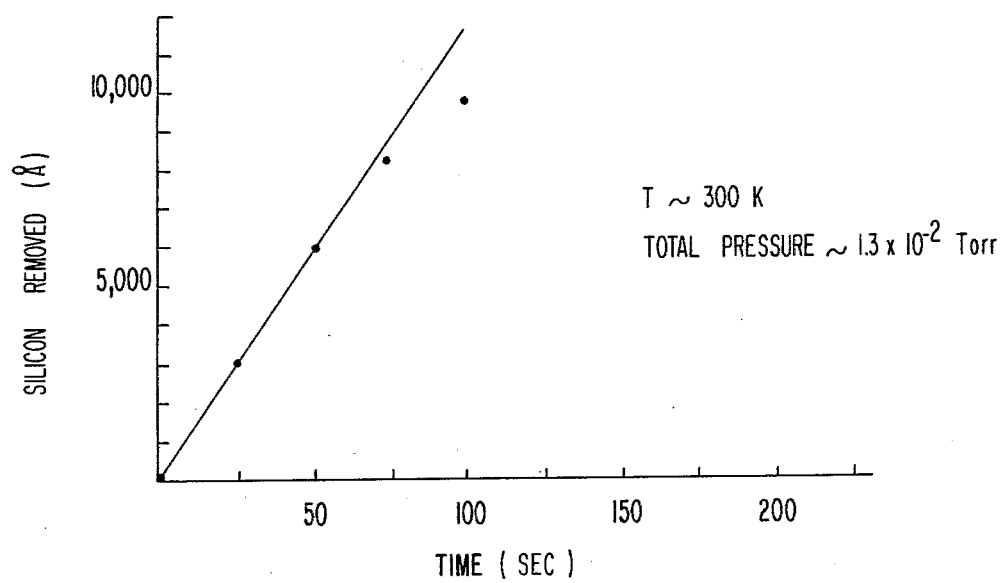
FIG. 2 illustrates the etch rate at the stated conditions for silicon.

The present invention provides for extremely fast etch rates as illustrated by FIG. 2. Etch rates of several thousand angstroms per minute are readily obtainable by following the process of the present invention. FIG. 2 shows an etch rate for silicon of 7,000 angstroms per minute being readily obtained.

The process of the present invention is generally carried out at normal room temperatures (e.g., about 300° K.) or less. Higher temperatures can be employed when desired.

Substrates of the present invention other than silicon have also been etched. It has been noted that the etch rate of titanium has been about five times that of silicon and the etch rate of molybdenum has been about twice as fast as that of silicon.

Also, it has been noted that the etch rate of tantalum has been about one-half that of silicon.

The following examples are provided to further illustrate the present invention.

EXAMPLE 1

A silicon film of about 10,000 angstroms deposited on a quartz crystal microbalance in a vacuum chamber is exposed to $XeF_2$ at a flow rate of about $10^{-1}$ torr liter/second. The temperature during the etching is about 300° K. The results obtained are illustrated in FIG. 2.

As illustrated in FIG. 2, the etch rate is about 7,000 angstroms/minute and is substantially independent of time and will be dependent upon the pressure and temperature employed. The slight deviation from linear curve at about T equals 100 seconds resulted from the fact that most of the silicon had already been etched at that point.

INDUSTRIAL APPLICABILITY

A number of different films may be etched.

EXAMPLE 2

A titanium film of about 1μ thickness was deposited on a quartz crystal microbalance which was subsequently mounted in a vacuum system where the total pressure was always less than $1 \times 10^{-6}$ torr during etching. A flux of $2.3 \times 10^{15}$ $XeF_2$ molecules/second leaving a small tube (diameter=1.6 mm) and going directly to the titanium film (distance=3 mm) produced an etch rate of 49 Å/min (T=300 K).

EXAMPLE 3

Under conditions similar to those described in Example 2, a flux of $2.9 \times 10^{15}$ $XeF_2$ molecules/second produced an etch rate of 28.7 Å/min for a ~1μ thick molybdenum film.

EXAMPLE 4

Under conditions similar to those described in Example 2, a flux of $7 \times 10^{15}$ $XeF_2$ molecules/second produced an etch rate of 27 Å/min for a ~1μ thick silicon film.

EXAMPLE 5

Under conditions similar to those described in Example 2, a flux of $1.9 \times 10^{15}$ $XeF_2$ molecules/second produced an etch rate of 1.86 Å/min for a ~1μ thick tantalum film.

Having thus described my invention, what I claim as new, and desire to secure by Letters Patent is:

1. A method for etching a surface comprising exposing the surface to be etched to at least one noble gas halide for a sufficient time to etch said surface to the desired extent.

2. The method of claim 1 wherein said halide is a fluoride.

3. The method of claim 1 wherein said noble gas halide is a fluorinated xenon compound.

4. The method of claim 1 wherein said noble gas halide is selected from the group of $XeF_2$, $XeF_4$, $XeF_6$, $KrF_2$, $KrF_4$, $KrF_6$, and mixtures thereof.

5. The method of claim 1 wherein said noble gas halide is $XeF_2$.

6. The method of claim 1 wherein all of the constituents of the surface are capable of forming volatile substances.

7. The method of claim 1 wherein said surface is silicon or polycrystalline silicon.

8. The method of claim 1 wherein said surface is titanium.

9. The method of claim 1 wherein said surface is molybdenum.

10. The method of claim 1 wherein said surface is tantalum.

11. The method of claim 1 wherein the etching is carried out under vacuum.

12. The method of claim 1 wherein the etching is carried out at a pressure of about $10^{-4}$ torr to about 1 torr.

13. The method of claim 1 wherein the etching is carried out at a pressure of about $10^{-3}$ torr to about $10^{-2}$ torr.

14. The method of claim 1 wherein a plasma etching process is employed.

15. The method of claim 1 wherein a sputter etching process is employed.

16. The method of claim 1 wherein said noble gas halide is passed through at least one capillary tube to said surface.

* * * * *